(12) United States Patent
Kitamoto

(10) Patent No.: US 8,148,980 B2
(45) Date of Patent: Apr. 3, 2012

(54) MAGNETIC RESONANCE IMAGING SYSTEM AND METHOD

(75) Inventor: Naoya Kitamoto, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 375 days.

(21) Appl. No.: 12/593,652

(22) PCT Filed: Apr. 17, 2008

(86) PCT No.: PCT/JP2008/057502
§ 371 (c)(1),
(2), (4) Date: Sep. 29, 2009

(87) PCT Pub. No.: WO2008/136274
PCT Pub. Date: Nov. 13, 2008

(65) Prior Publication Data
US 2010/0134107 A1    Jun. 3, 2010

(30) Foreign Application Priority Data
Apr. 27, 2007 (JP) .................................. 2007-119247

(51) Int. Cl.
*G01V 3/00* (2006.01)
(52) U.S. Cl. ...................................... 324/307; 324/309
(58) Field of Classification Search .......... 324/300–322; 600/407–445
See application file for complete search history.

(56) References Cited

U.S. PATENT DOCUMENTS

| 7,797,031 B1 * | 9/2010 | Foo ............................... 600/410 |
| 7,821,265 B2 * | 10/2010 | Busse ........................... 324/309 |
| 2004/0039276 A1 | 2/2004 | Ikezaki |
| 2005/0215881 A1 * | 9/2005 | Van Zijl et al. ............... 600/410 |
| 2010/0052675 A1 * | 3/2010 | Priatna et al. ................. 324/309 |

FOREIGN PATENT DOCUMENTS

| JP | 2002-85376 | 3/2002 |
| JP | 2004-73538 | 3/2004 |
| JP | 3576069 | 10/2004 |
| JP | 2006-81704 | 3/2006 |

* cited by examiner

*Primary Examiner* — Brij Shrivastav
(74) *Attorney, Agent, or Firm* — Cooper & Dunham LLP

(57) ABSTRACT

A magnetic resonance imaging system is characterized in that a control unit executes, as pulse sequences, a first sequence for obtaining data of a predetermined 2-dimensional region in a k-space and a second sequence for obtaining data required for reconstruction of an image by irradiating an object to be examined with an inversion recovery pulse and corrects the phase of the data obtained by the second sequence with the data of the 2-dimensional region obtained by the first sequence, and in that a signal processing unit reconstructs a real component image with corrected data.

Upon execution of the first sequence, the control unit obtains the data of the predetermined 2-dimensional region in the k-space while varying a phase encoding amount.

12 Claims, 7 Drawing Sheets

MAGNETIC RESONANCE IMAGING SYSTEM AND METHOD

TECHNICAL FIELD

The present invention relates to a magnetic resonance imaging apparatus (hereinafter referred to as an MRI apparatus) and method, particularly to the MRI apparatus and method for obtaining a real component image using the inversion recovery method that applies an inversion recovery pulse (IR pulse) before acquiring image data.

BACKGROUND ART

Magnetic resonance imaging apparatuses irradiate high-frequency magnetic pulses in the condition that an object to be examined is placed in a homogeneous magnetic field to excite atomic nuclei such as hydrogen in the living body, and measure nuclear magnetic resonance signals (NMR signals) produced by the excitation. Then the measurement regions in the living body are to be imaged and displayed based on the magnetic resonance information such as the density distribution of the measured signals or distribution of relaxation time thereof, to be used for purposes such as medical diagnosis.

Such MRI apparatuses can obtain a T1 weighted image by reflecting the difference of longitudinal relaxation time of the atomic nucleus spin in the respective tissues (T1) to the contrast of the image. As for the method for imaging T1 weighted images, for example, there is the IR method for contrastively reflecting longitudinal magnetic intensity of the respective tissues to the image in the TI elapsed time by first applying IR pulses, acquiring echo signals by a method such as the spin echo method or gradient echo method after the passage of a predetermined inversion time (TI) and reconstructing a real component image.

The usual magnetic resonance imaging method reconstructs and displays absolute value images wherein the real component and imaginary component are made into an absolute value after the echo signal is performed with quadrature detection.

However, in the case of imaging and reconstructing by adding IR pulses in the above-described IR method, there is a difficulty in acquiring accurate T1 contrast attributed to the folding generated in the signal intensity of longitudinal magnetization having a negative value upon TI time passage. Due to this, the method is often used for acquiring accurate T1 contrast by preventing the generation of folding of signal intensity through reconstructing images using only real components and maintaining a sign of longitudinal magnetization of the respective tissues in a predetermined TI.

In Patent Document 1, upon performing image reconstruction using only real component in the IR method, the phase data to be the reference is obtained by performing template scan by setting the phase encode as zero without applying IR pulses before the imaging scan for acquiring the echo signals for image reconstruction. And the method is disclosed therein for obtaining an image wherein positive and negative polar characters are correct by correcting the signals acquired in the measurement for image acquisition using the reference phase data. By such method, it is possible to obtain a T1 weighted image which accurately reflects T1 contrast.

Patent Document 1: Japanese Patent No. 3576069

DISCLOSURE OF THE INVENTION

Problems to be Solved

However, generation of spatial distribution of phase variation (phase error distribution) occurs in the measured NMR signals attributed to the apparatuses or environment such as inhomogeneity of the static magnetic field in the imaging space or inhomogeneity of the readout gradient magnetic field.

Especially in the case of imaging using a multi-coil formed by a plurality of element coils, the error is overlapped on the echo signals acquired while having two-dimensionally different characteristics by each reception coils. As a result, even though the phase of the measurement for image acquisition is corrected by using a reference phase data obtained by setting the phase encode as zero and the images of only a real component in the respective channels are synthesized using the technique disclosed in Patent Document 1, since the phase error distribution by the respective reception coils can not be corrected, accurate real component images can not be obtained.

The objective of the present invention is to provide an MRI apparatus to perform imaging by the IR method for generating a real component image thereof so as to correct special phase variation of NMR signals attributed to matters other than the object with high accuracy and obtain a real component image.

Means for Solving the Problem

In order to achieve the above-described objective, the magnetic resonance imaging apparatus of the present invention comprises:

a static magnetic field generating unit configured to generate a static magnetic resonance in an imaging space;

a gradient magnetic field generating unit configured to apply a gradient magnetic field pulse to an object placed in the imaging space;

a high-frequency irradiation unit configured to irradiate a high-frequency magnetic field pulse to the object;

a reception unit configured to obtain a nuclear magnetic resonance signal produced from the object;

a signal processing unit configured to reconstruct an image by performing arithmetic processing on the signal obtained by the reception unit; and a control unit configured to control the operation of the high-frequency irradiation unit, the gradient magnetic field generating unit and the reception unit so as to execute a predetermined pulse sequence, wherein:

the control unit executes, as pulse sequences, a first sequence for acquiring data of a predetermined 2-dimensional region in a k-space and a second sequence for acquiring data necessary for image reconstruction by irradiating an IR pulse to the object, and corrects phase of the data acquired in the second sequence using the data of the 2-dimensional region acquired in the first sequence; and the signal processing unit reconstructs a real component image using the data after being corrected, characterized in that the control unit acquires the data of the predetermined 2-dimensional region in the k-space while varying the phase encoding amount upon executing the first sequence.

Also, the magnetic resonance imaging method of the present invention which obtains a real component image using the inversion recovery method for applying an IR pulse before acquiring image data comprises:

a step of executing a first sequence for acquiring data of a predetermined 2-dimensional region in a k-space;

a step of executing a second sequence for acquiring the data necessary for image reconstruction by irradiating an IR pulse to the object; and a step of correcting phase of the data acquired by the second sequence using data of the 2-dimensional region acquired in the first sequence, wherein the signal processing unit comprises a step of reconstructing a real component image using the data after being corrected, characterized in that the first sequence acquires data of the predetermined 2-dimensional region in the k-space while varying the phase encoding amount.

Effect of the Invention

In accordance with the present invention, it is possible to obtain a real component image with high accuracy by correcting spatial phase variation of NMR signals.

BRIEF DESCRIPTION OF THE DIAGRAMS

DESCRIPTION OF REFERENCE NUMERALS

301: step 301 (placement of an object), 302: step 302 (automatic judgment of a high-frequency reception coil), 303: step 303 (execution of a pulse sequence for phase correction data), 304: step 304 (2-dimensional Fourier transformation), 305: step 305 (generation of a 2-dimensional phase correction map), 306: step 306 (execution of a pulse sequence for main measurement data), 307: step 307 (2-dimensional Fourier transformation), 308: step 308 (generation of a 2-dimensional phase map), 309: step 309 (correction of image acquisition data), 310: step 310 (reconstruction of a real component image), 311: step 311 (display of a real component image and 2-dimensional phase correction map)

BEST MODE FOR CARRYING OUT THE INVENTION

Hereinafter, an embodiment of the present invention will be described in detail referring to the diagrams.

First, general configuration of the MRI apparatus related to the present embodiment will be described using the block diagram shown in FIG. 1.

Figure 1:
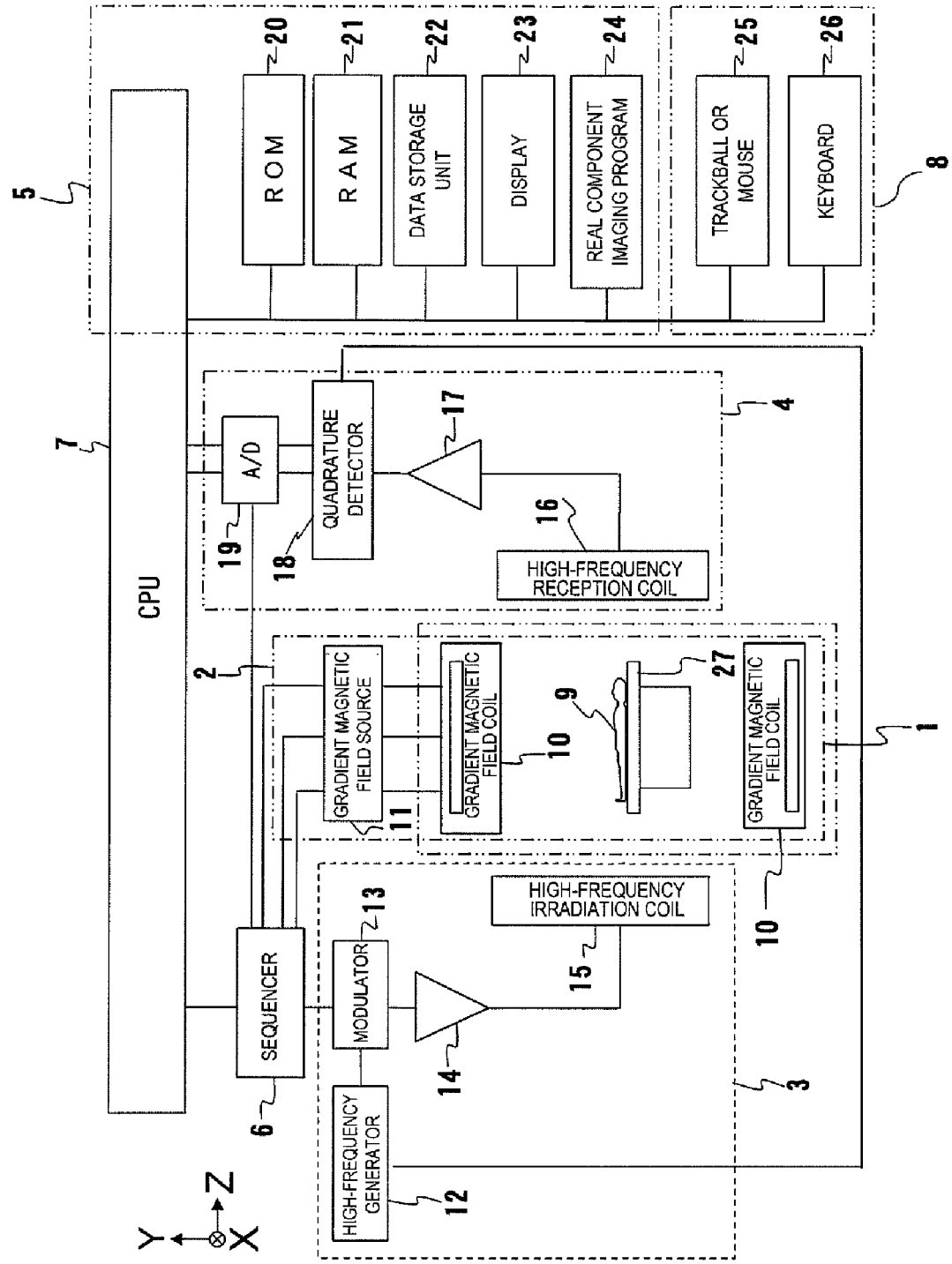
FIG. 1 is a block diagram showing a general configuration of the MRI apparatus of the present embodiment.

This MRI apparatus is for obtaining a tomographic image of an object to be examined using nuclear magnetic resonance phenomenon, comprising static magnetic field generation system 1, gradient magnetic field generation system 2, transmission system 3, reception system 4, signal processing system 5, sequencer 6, central processing unit (CPU) 7, console 8 and table 27 on which object 9 is placed, as shown in FIG. 1.

Static magnetic field generation system 1 has a static magnetic field generation device for generating homogeneous static magnetic field in the body-axis direction (Z-direction) or the direction orthogonal to the body axis (X or Y-direction) around object 9. As for the static magnetic field generation device, the device using the permanent magnet method, normal-conducting method or superconducting method can be used. The static magnetic field generation device is installed in a space having a certain extensity around object 9. Gradient magnetic field generation system 2 includes gradient magnetic field coil 10 wound in three-axis directions of X, Y and Z and gradient magnetic field source 11 which drives the respective coils, for applying gradient magnetic field to object 9 in three-axis directions of X, Y and Z by driving gradient magnetic field source 11 of the respective coils of gradient magnetic field coil 10 according to the command from sequencer 6 to be described later. Depending on the method for adding the gradient magnetic field, setting of a slice plane with respect to object 9 or application of the phase encode and the encode in the readout direction can be carried out.

Transmission system 3 is for irradiating to object 9 high-frequency magnetic field (RF) pulses which cause the atomic nuclei of atomic elements that configure biological tissues of object 9 to produce nuclear magnetic resonance, and includes high-frequency oscillator 12, modulator 13, high-frequency amplifier 14 and high-frequency irradiation coil 15 on the transmission side. In such configuration, RF pulses are irradiated by amplifying the high-frequency pulses outputted from high-frequency oscillator 12 in accordance with the high-frequency magnetic field pulses transmitted from sequencer 6 by high-frequency amplifier 14 and providing the amplified high-frequency pulses to high-frequency irradiation coil 15 disposed in the vicinity of object 9.

Reception system 4 is for detecting the echo signals emitted by nuclear magnetic resonance of an atomic nuclei in biological tissues of object 9 (NMR signals), and includes high-frequency reception coil 16, amplifier 17, quadrature detector 18 and AD converter 19. The NMR signals produced from object 9 by receiving RF pulses from transmission system 3 are detected in high-frequency reception coil 16 of reception system 4 placed in the vicinity of object 9, amplified by amplifier 17, and a real component and an imaginary component are detected by quadrature detector 18 in the timing depending on the command from sequencer 6. These NMR signals are converted into digital quantity by AD converter 19 as two series of collected data, and transmitted to signal processing system 5.

Signal processing system 5 is for performing processes such as image reconstruction calculation using the NMR signals detected in reception system 4 and displaying the reconstructed images, and includes CPU 7, ROM 20, RAM 21, data storage unit 22, display 23 and real component imaging program storage unit 24. CPU 7 is for controlling processing with respect to the NMR signals such as Fourier transformation, correction coefficient calculation and image reconstruction and controlling sequencer 6. In ROM 20, programs for performing time-lapse image analysis process or measurement, or invariable parameter to be used therefore are stored in advance. In RAM 21, the measurement parameter acquired in the previous measurement, NMR signals detected in reception system 4, images to use for setting regions of interest, and the parameter for setting the regions of interest, etc. are temporarily stored.

Data storage unit 22 is for recording the image data reconstructed in CPU 7. For example, a magnet disk device or an optical magnet disk device can be used therefore. On display 23, the image data stored in data storage unit 22 is visualized and displayed as tomographic images, etc.

Real component imaging program storage unit 24 stores the program for imaging or reconstructing highly accurate real component images wherein the distribution of phase variation in the imaging space is corrected.

The details of the program thereof will be described later.

Sequencer 6 is operated under control of CPU 7, and is configured to transmit various commands necessary for collecting data of tomographic images of object 9 in predetermined timings to transmission system 3, gradient magnetic field generation system 2 and reception system 4. By such configuration, a desired imaging method can be carried out by executing, according to a predetermined pulse sequence, operation to irradiate RF pulses from transmission system 3 for causing an atomic nuclei of atomic elements by which biological tissues of object 9 are formed nuclear magnetic resonance, apply a gradient magnetic field in a predetermined direction from gradient magnetic field generation system 2, and acquire the NMR signals produced from object 9 by reception system 4.

Console 8 is for receiving from the operator the selection of imaging methods and imaging conditions or the input of control information on the process to be carried out in signal processing unit 5, and includes a mouse, trackball 25 or keyboard 26.

Embodiment 1

Next, the method for imaging real component images using the MRI apparatus of the present embodiment will be described referring to FIG. 2-FIG. 5. As an imaging method, the pulse sequence (imaging method) for obtaining real component images by the IR method for applying inversion recovery (IR) pulses is to be used. Any sequence such as spin echo sequence or gradient echo sequence may be used for collecting the NMR signals by which the pulse sequences are formed. In the embodiment below, the imaging method for collecting echo signals by high-speed spin echo sequence after applying IR pulses will be exemplified.

Figure 2:
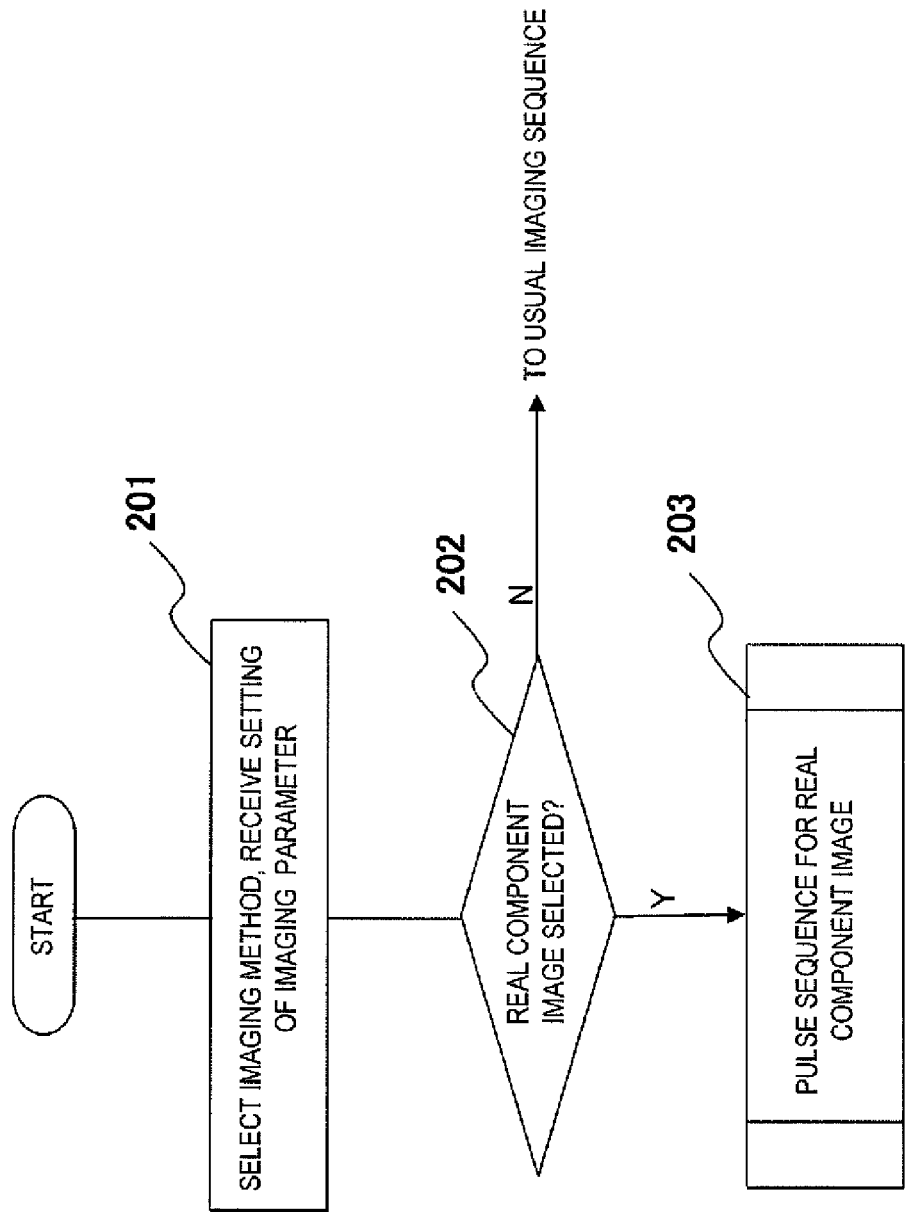
FIG. 2 is a flowchart showing the imaging operation of a real component image by the MRI apparatus in FIG. 1.
Figure 3:
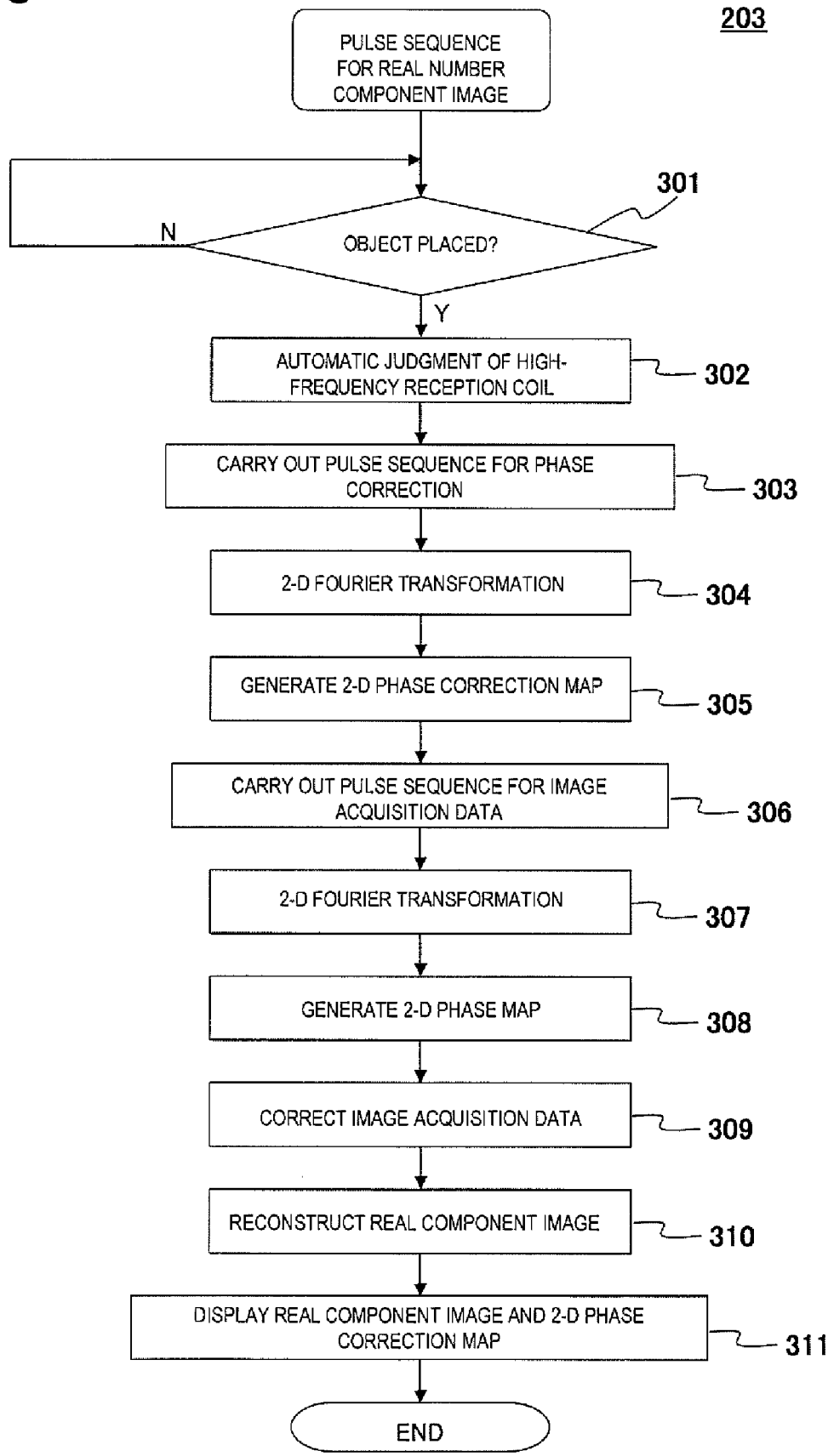
FIG. 3 is a flowchart showing the imaging operation of a real component image by the MRI apparatus in FIG. 1.

In real component imaging program storage unit 24 of the signal processing system in the MRI apparatus, the program for executing the operation in the flowcharts shown in FIG. 2 and FIG. 3 is stored. CPU 7 carries out imaging or reconstruction operation as will be described below by reading and executing the stored program.

First, the flowchart in FIG. 2 will be described.

(Step 201)

CPU 7 displays the screen for receiving the selection of the imaging method and the setting of the imaging parameter, and receives from an operator the selection of the imaging method and the setting of the imaging parameter via console 8.

(Step 202)

In the case that the selected imaging method uses the IR method and the real component image is to be reconstructed in the imaging parameter, step 203 is carried out and the pulse sequence for real component images is to be performed.

On the contrary, in the case that the selected imaging method is not the IR method or in the case that the IR method is selected but reconstruction of a real component image is not being set (for example, an absolute image is set to be reconstructed, etc.), usual imaging sequence and image reconstruction are to be carried out.

The pulse sequence for real component images in step 203 of FIG. 2 will be concretely described using the flowchart in FIG. 3.

(Step 301)

First, CPU 7 displays the screen on display 23 for the operator to confirm whether object 9 placed on table 27 is arranged in the imaging space and high-frequency reception coil 16 is disposed.

(Step 302)

When the operator confirmed that object 9 is placed, etc. via the operation using console 8, the magnetic resonance imaging apparatus automatically determines the kind of high-frequency reception coil 16 being disposed along with object 9.

As for the technique for automatic determination of high-frequency reception coil 16, the commonly-known technique is to be used. At this time, in the case that the imaging method is the one which uses a multi coil and the multi coil formed by a plurality of element coils having different characteristics is disposed as high-frequency reception coil 16, the kind of the respective element coils may be discriminated.

(Step 303)

Figure 4:
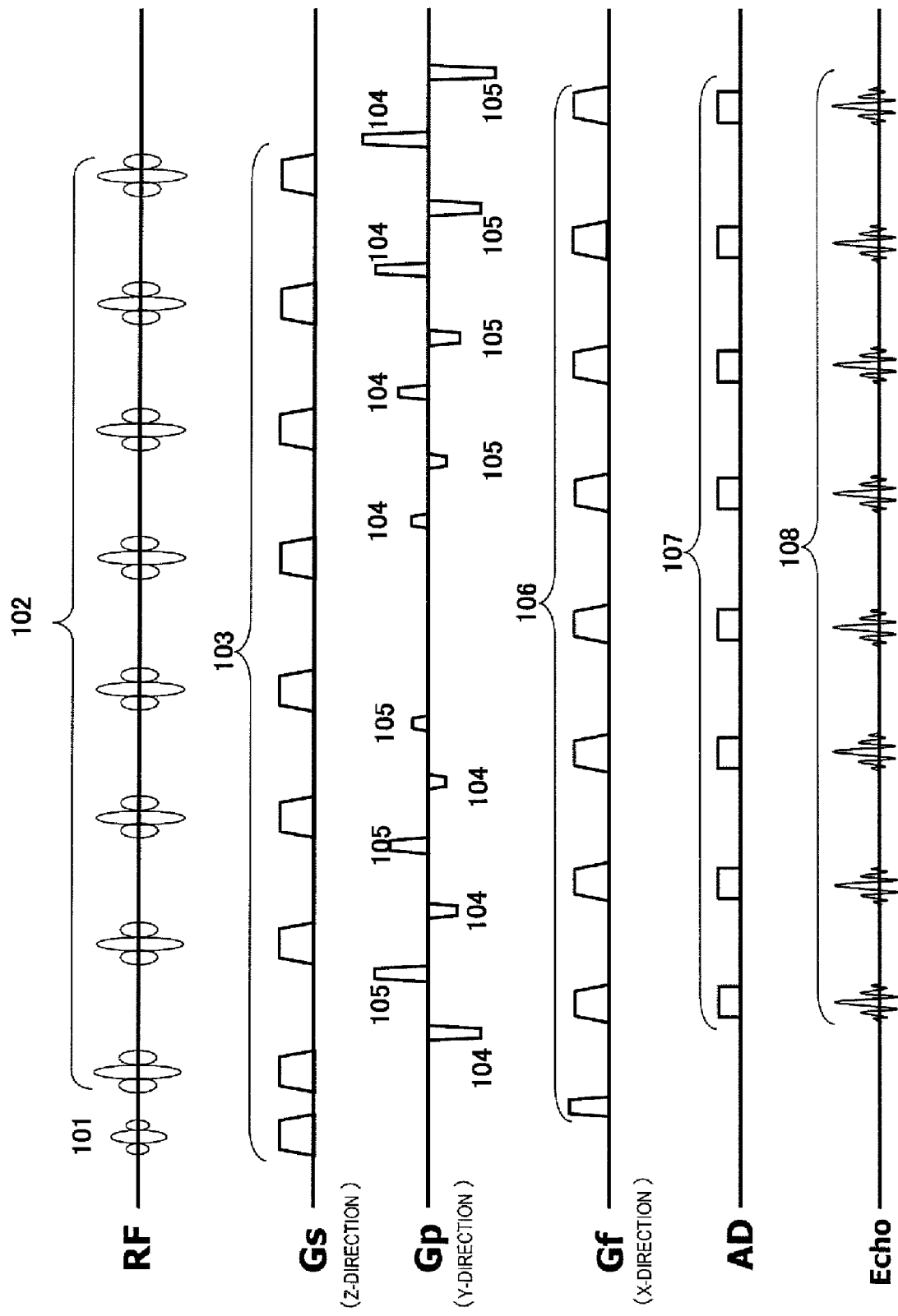
FIG. 4 is an explanatory diagram showing a pulse sequence for phase correction data to be used in the procedure of FIG. 3.

Next, CPU 7 carries out the pulse sequence for phase correction shown in FIG. 4 under the control of sequencer 6 to measure the phase distribution produced in the imaging space due to the MRI apparatus or environment, and acquires the NMR signals.

Figure 5:
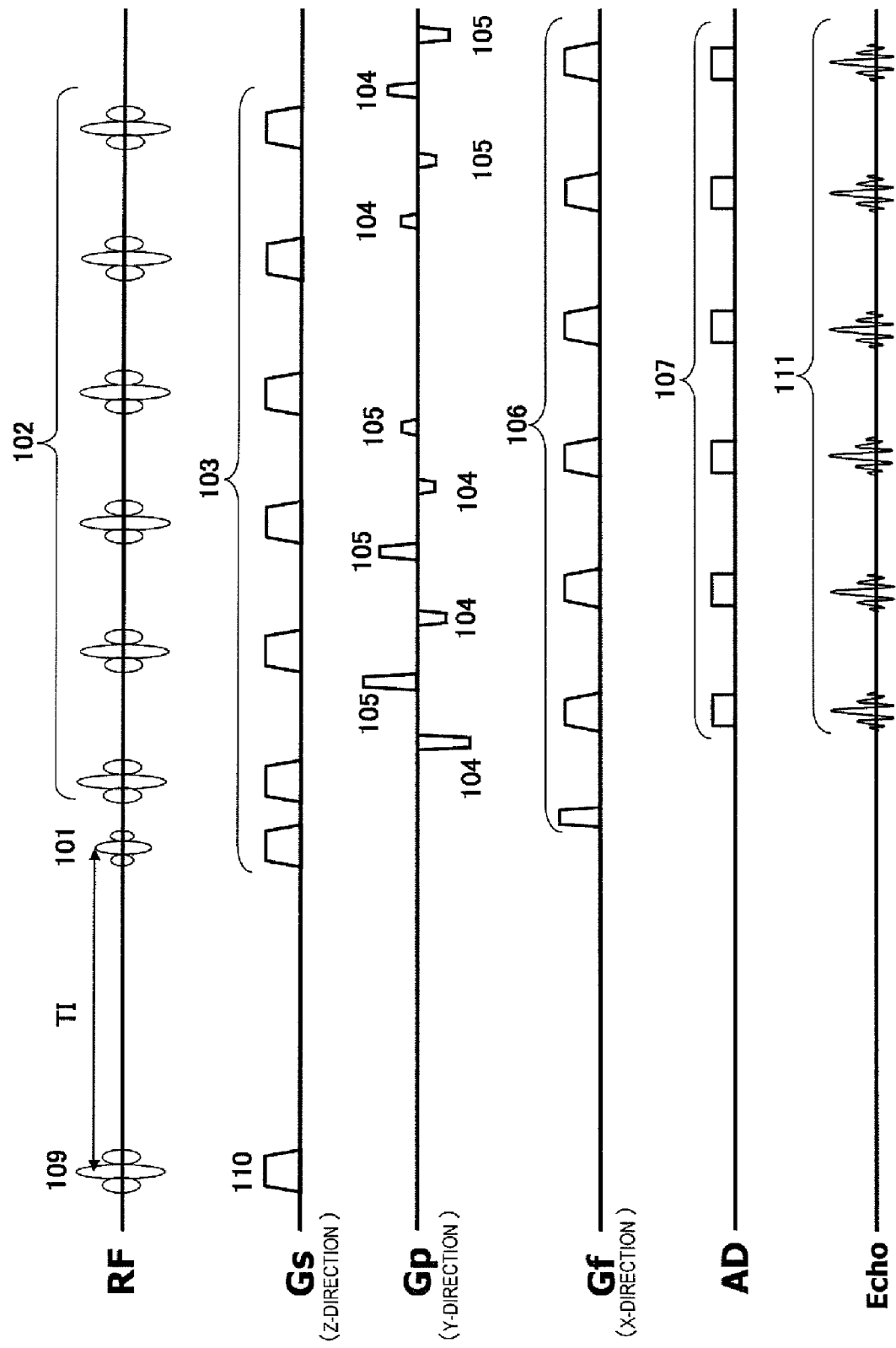
FIG. 5 is an explanatory diagram showing a pulse sequence for image acquisition data to be used in the procedure of FIG. 3.

The pulse sequence for phase correction (first sequence) in FIG. 4 is the sequence wherein IR pulse 109 and slice selecting gradient magnetic field pulse 110 to be applied at the same time with IR pulse 109 are excluded from the pulse sequence for image acquisition (second sequence) in FIG. 5, for obtaining data (NMR signals) of a predetermined 2-dimensional region in a k-space while varying the phase encoding amount. In this regard, however, the sequence in FIG. 4 and FIG. 5 respectively indicates from top down, an RF pulse to be irradiated from high-frequency irradiation coil 15, slice selecting gradient magnetic field Gs to be applied from gradient magnetic field coil 10, phase encode gradient magnetic field Gp, readout direction gradient magnetic field Gf, a sampling window AD of AD modulator 19 and an echo signal which is an NMR signal, while the vertical axis indicates their intensity and the horizontal axis indicates time. While slice selecting gradient magnetic field Gs is made in line with Z-direction, phase encode gradient magnetic field Gp is in Y-direction and readout direction gradient magnetic field is in X-direction as an example in FIG. 4 and FIG. 5, they can be set in arbitrary directions.

Also, as to be described later, while the pulse sequence for image acquisition in FIG. 5 is to be repeated a predetermined number of times, the pulse sequence for phase correction in FIG. 4 is to be carried out only one time. Also, while the pulse sequence for image acquisition in FIG. 5 is set to phase encode from the low-frequency region to the high-frequency region in a k-space as the application amount of phase encode gradient magnetic field (Gp) pulse 104, the pulse sequence for phase correction in FIG. 4 acquires only echo signal 108 of a predetermined low-frequency region in the k-space, thus the application amount of phase encode gradient magnetic field (Gp) pulse 104 is to be set in the amount which corresponds to the low-frequency region.

Figure 6:
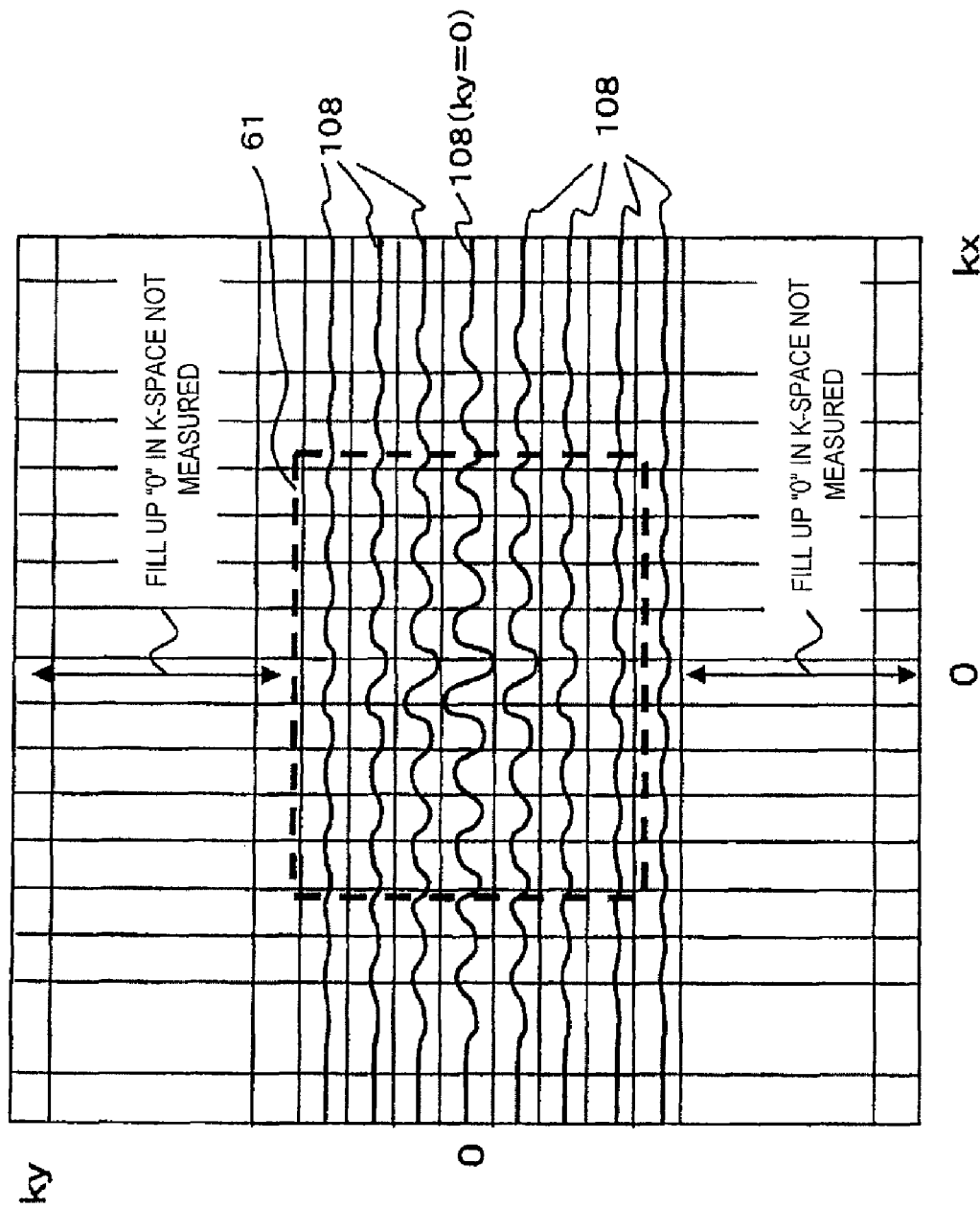
FIG. 6 is an explanatory diagram showing the condition that the data acquired by the pulse sequence in FIG. 4 is placed in a k-space.

The phase component of the echo signals wherein the special frequency is the low-frequency region in a k-space has a great influence on a real component image (T1 weighted image) to be reconstructed. Therefore, in the low-frequency region in the k-space, it is possible to effectively improve accuracy of T1 weighted images by correcting the phase variation of the echo signals attributed to the apparatus or environment. Given this factor, with respect to region 61 in the low-frequency region including the point wherein special frequencies "kx" and "ky" are zero in the a k-space as shown in FIG. 6, spin echo 108 is to be obtained by the pulse sequence for phase correction in FIG. 4. In concrete terms, as shown in FIG. 6, spin echo 108 of a predetermined number (8 here as an example) wherein ky=0 and in the vicinity thereof is to be obtained. In this manner, since spin echo signals 108 of an arbitrary predetermined number (for example, 8) which is less than the number of spin echo signals 111 to be obtained in image acquisition sequence (for example, 256) should be obtained, the pulse sequence for phase correction can be completed in a short period of time.

While the intensity of phase encode gradient magnetic field Gp to be applied upon acquisition of an echo signal is the same as the case of acquiring echo signals 111 of a predetermined number in the vicinity of ky=0 in the measurement for image acquisition shown in FIG. 5, the application order of the respective phase encode gradient magnetic fields may be different from the one in the measurement for image acquisition.

The eight echo signals 108 are respectively performed with quadrature detection by quadrature detector 18 of reception system 4, and respectively turns out to be two series of collected data of an imaginary component and a real component. CPU 7 arranges the collected data in the vicinity of ky=0 in the k-space having the same size of matrix which is separate from the measurement for image acquisition as shown in FIG. 6 according to the phase encoding amount thereof. While the sine components of echo signals 108 are indicated as continued analogue data in FIG. 6 as a matter of convenience, since they are converted into digital data by AD converter 19, the numeric values equivalent to the amplitude of analogue data are to be arranged in each matrix in the k-space of FIG. 6.

Since the number of echo signals 108 obtained in the pulse sequence for correction (for example, 8) is less than echo signals 111 obtained in the measurement for image acquisition (for example, 256), zero is to be allotted as a data value in the high-frequency region of "ky" where echo signals 108 are not filled in the k-space.

(Steps 304 and 305)

CPU 7 generates the phase distribution in the xy-space, i.e. 2-dimensional phase correction map by performing 2-dimensional Fourier transformation on the signal data of the k-space in FIG. 6.

Figure 7:
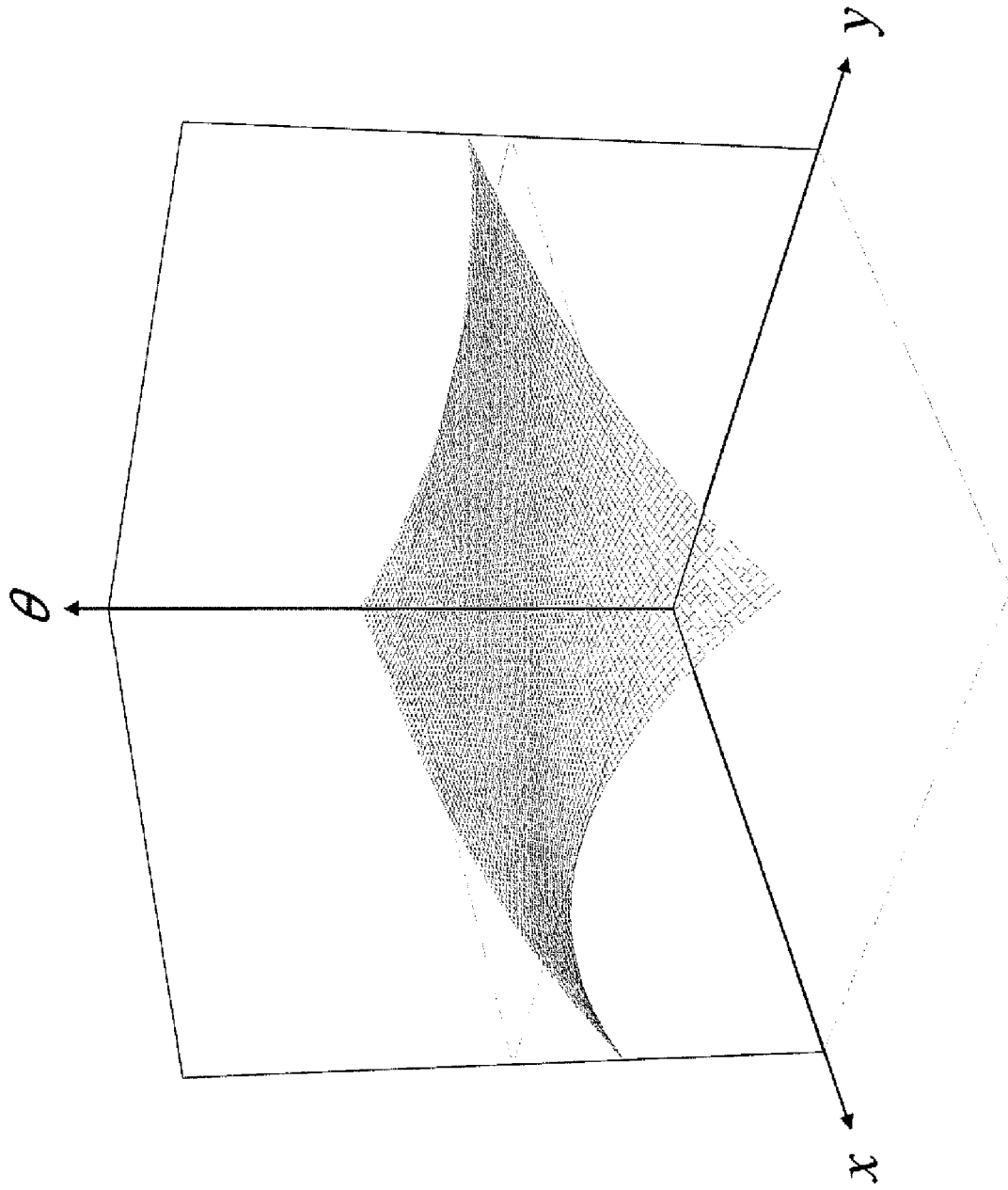
FIG. 7 is an explanatory diagram showing phase distribution in the xy-space obtained by performing Fourier transformation on the k-space data in FIG. 6 (2-dimensional phase correction map).

FIG. 7 shows the generated 2-dimensional phase correction map. The 2-dimensional phase correction map does not include the phase inversion by an IR pulse since it is obtained by the pulse sequence which does not include an IR pulse as shown in FIG. 4, and indicates the spatial phase distribution attributed to the apparatus or environment such as inhomogeneity of static magnetic field or inhomogeneity of readout gradient magnetic field.

(Step 306)

Next, CPU 7 causes sequencer 6 to execute the pulse sequence for image acquisition shown in FIG. 5, and obtains echo signals 111 of the measurement for image acquisition.

The content of the pulse sequence for image acquisition in FIG. 5 will be described. The pulse sequence for image acquisition shown in FIG. 5 uses the sequence referred to as the "fast IR method" for collecting echo signals by the high-speed spin echo sequence (FSE) after applying IR pulse 109.

In the pulse sequence for image acquisition in FIG. 5, by irradiating RF pulse (IR pulse) 109 which excites the nuclear magnetism for 180 degrees and applying slice selecting gradient magnetic field pulse 110 at the same time, the longitudinal magnetization in a desired region (slice) of the object is inverted 180 degrees. After passing of inversion time (TI), by irradiating RF pulse 101 to excite the nuclear magnetism for 90 degrees and applying slice selecting gradient magnetic field pulse 103 at the same time, the magnetization recovered by longitudinal relaxation during inversion time TI is excited in the desired region of the object. Then by continuously and repeatedly applying 180-degree RF pulse 102 and slice selecting gradient magnetic fields 103 at predetermined intervals, spin echo signal 111 which is re-bundled in sampling window 107 is measured. At this time, by applying Gp pulse 104 and Gf pulse 106 between 180-degree RF pulses 102, offset of the phase encode and offset in the readout direction are provided. The offset of the phase encode by Gp pulses 104 is to be varied by a predetermined amount with respect to every application. After application of Gp pulses 104 between the respective 180-degree RF pulses 102, rewind pulses 105 which have the same intensity and the opposite polar characteristic with respect to Gp pulse 104 so as to prevent the phase distribution by Gp pulses 104 from accumulating.

The pulse sequence for image acquisition collects spin echo signals 111 respectively having different offset of phase encode by repeating the pulse sequence in FIG. 5 one or more times. The number of spin echo signals 111 to be obtained is equivalent to the number necessary for image reconstruction (for example, 256). In this manner, spin echo signals 111 having different intensities are collected from the tissues having different T1, thus it is possible to obtain the image reflecting T1 contrast, i.e. a T1 weighted image.

The number of echo signals 111 to be obtained in measurement for image acquisition is equivalent to the number necessary for image reconstruction (for example, 256). Two series of collected data wherein echo signals 111 are quadrature detected are disposed in a k-space of the same matrix as in FIG. 6.

(Steps 307 and 308)

By performing 2-dimensional Fourier transformation on the disposed data, a 2-dimensional phase map in the xy-space is generated.

(Step 309)

CPU 7 corrects the data obtained by the measurement for image acquisition using the 2-dimensional phase correction map (FIG. 7) acquired in step 305. More specifically, by subtracting the phase rotational amount of the matrix corresponding to the 2-dimensional phase correction map from the phase rotational amount of the 2-dimensional phase map in the measurement for image acquisition, the spatial phase variation attributed to the apparatus or environment is corrected. In this manner, only the phase inversion of 180-degrees by RI pulse 109 is included in the corrected 2-dimensional phase map of the measurement for image acquisition, thus it is possible to accurately reflect the signals from the tissues having different T1 to the contrast of the image.

(Step 310)

A real component image is reconstructed from the real components of echo signals 111 after the correction.

(Step 311)

The reconstructed real component image and the 2-dimensional phase correction map in FIG. 7 are displayed on display 23.

In the case that the imaging method is multi-coil imaging, etc. and high-frequency reception coil 16 formed by a plurality of element coils having different phase characteristics is used, the 2-dimensional phase correction map is generated respectively by carrying out steps 304 and 305 for each element coil, and correction of the image acquisition data is to be performed by carrying out steps 308-310 for each element coil in the measurement for image acquisition. In this manner, the phase distribution can be corrected for each element coil (i.e. for each channel) having different phase characteristics, thus it is possible to perform accurate reconstruction of real component images.

In accordance with the present invention, since spatial distribution of the phase variation attributed to the characteristic of the apparatus or environment can be corrected, real component images (T1 weighted images) wherein the variation of longitudinal magnetization inverted by IR pulses is accurately reflected can be reconstructed.

Especially in the imaging method which uses a plurality of coils having different 2-dimensional phases between the plurality of reception coils, it is possible to correct the phase distribution for each channel since the present invention generates a phase correction map for each coil. Therefore, in the case of multi-coil imaging, images of the respective channels can be easily synthesized without performing any particular process.

Also, the pulse sequence for image acquisition which is the second sequence in the present embodiment includes the IR pulse and the signal-collecting pulse series for collecting nuclear magnetic resonance signals from the nuclear magnetism inverted by the IR pulse. On the other hand, the pulse sequence for phase correction data which is the first sequence includes the pulse series which is the same as the signal collecting pulse series, and is the sequence wherein the IR pulse, etc. is excluded from the pulse sequence for image acquisition. In this manner, the pulse sequence for phase correction data can be easily generated.

Since the echo signals which determines the phase distribution are in the low frequency region 61, only the signals necessary to fill up a predetermined low-frequency region need to be obtained, and the first sequence can be easily executed as a pre-scan of the measurement for image acquisition.

Also, any kind of pulse sequence may be used for collecting NMR signals in measurement for image acquisition, thus phase correction can be performed using a variety of imaging methods.

While a predetermined number (eight)) of echo signals 108 are obtained as in the measurement for image acquisition for acquiring the data of low-frequency region 61 in the k-space as the phase correction data in the above-described embodiment, the present invention does not have to be limited to this method. The imaging can be performed using a parameter other than the measurement for image acquisition as long as the method is capable of acquiring the data of low frequency region 61 in the k-space. In the case of arranging the phase correction data acquired using the parameter other than the measurement for image acquisition in the k-space matrix, commonly-known interpolation process, etc. can be performed on the data to make it to be the same k-space matrix of the image acquisition data.

For example, the pulse sequence for phase correction data can obtain the data in low-frequency region 61 (FIG. 6) in a k-space using the spiral scan method which obtains NMR signals while varying the size of the gradient magnetic field for the phase encode and the size of the readout gradient magnetic field at the same time.

The invention claimed is:

1. A magnetic resonance imaging apparatus comprising:
a static magnetic field generation unit configured to generate a static magnetic field in an imaging space;
a gradient magnetic field generation unit configured to apply a gradient magnetic field pulse to an object to be examined who is placed in the imaging space;
a high-frequency irradiation unit configured to irradiate a high-frequency magnetic field pulse to the object;
a reception unit configured to acquire nuclear magnetic resonance signals produced from the object;
a signal processing unit configured to execute arithmetic processing on the signals acquired by the reception unit for reconstructing an image; and
a control unit configured to control the operation of the high-frequency irradiation unit, gradient magnetic field generation unit and reception unit so as to execute a predetermined pulse sequence, wherein:
the control unit executes a first sequence for obtaining the data in a predetermined 2-dimensional region in a k-space as the pulse sequence and a second sequence for obtaining the data necessary for imaging reconstruction by irradiating an IR pulse to the object, and corrects the phase of the data obtained in the second sequence using the data of the 2-dimensional region obtained in the first sequence; and
the signal processing unit reconstructs a real component image using the data after being corrected,
characterized in that the control unit obtains the data of a predetermined 2-dimensional region in the k-space while varying the phase encoding amount upon executing the first sequence.

2. The magnetic resonance imaging apparatus according to claim 1, characterized in that the first sequence obtains the data in a predetermined low-frequency region which includes the spatial frequency "0" in a k-space as a predetermined 2-dimensional region in the k-space.

3. The magnetic resonance imaging apparatus according to claim 2, wherein the control unit allocates "0" as the data value in the high-frequency region which is outside of the low-frequency region in the k-space to be obtained by the first sequence, so as to execute the correction.

4. The magnetic resonance imaging apparatus according to claim 1, wherein the control unit generates a 2-dimensional phase correction map by performing 2-dimensional Fourier transform-ation on the data in the k-space obtained by the first sequence, and corrects the phase of the data obtained by the second sequence using the generated map.

5. The magnetic resonance imaging apparatus according to claim 4, wherein:
the reception unit includes a plurality of reception coils which are disposed in the imaging space simultaneously for acquiring nuclear magnetic resonance signals respectively; and
the control unit generates the 2-dimensional phase correction map for each of the plurality of reception coils using the nuclear magnetic resonance signal acquired by the plurality of reception coils respectively in the first sequence, and corrects the signal data received by the plurality of reception coils respectively in the second sequence using the generated maps.

6. The magnetic resonance imaging apparatus according to claim 1, wherein:
the second sequence includes an IR pulse and a signal collecting pulse sequence for collecting nuclear magnetic resonance signals from the nuclear magnetization which is inverted by the IR pulse; and
the first sequence includes the pulse sequence which is the same as the signal collecting pulse sequence.

7. A magnetic resonance imaging method that obtains a real component image using the inversion recovery method that applies an IR pulse before acquiring image data comprising:

a step of executing a first sequence for acquiring the data of a predetermined 2-dimensional region in a k-space;

a step of executing a second sequence for acquiring the data necessary for imaging reconstruction by irradiating an IR pulse to the object;

a step of correcting the phase of the data acquired in the second sequence using the data of the 2-dimensional region acquired in the first sequence; and a step of reconstructing a real component image using the corrected data, characterized in that the first sequence acquires the data of a predetermined 2-dimensional region in the k-space while performing phase encode.

8. The magnetic resonance imaging method according to claim 7, wherein the first sequence obtains the data of the preset low-frequency region including spatial frequency "0" in a k-space as a predetermined 2-dimensional region in the k-space.

9. The magnetic resonance imaging method according to claim 8, wherein the correction is executed by allocating "0" as the data value in the high-frequency region which is outside of the low-frequency region in the k-space to be acquired in the first sequence.

10. The magnetic resonance imaging method according to claim 7, characterized in including:

a step of generating a 2-dimensional phase correction map by performing 2-dimensional Fourier transformation on the data in the k-space by the first sequence; and a step of correcting the phase of the data acquired in the second sequence using the 2-dimensional phase correction map.

11. The magnetic resonance imaging method according to claim 7, characterized in that the 2-dimensional phase correction map is generated for each of the plurality of reception coils using the nuclear resonance signals respectively acquired by the plurality of reception coils in the first sequence, and the correction is executed using the generated map on the signal data received by the plurality of reception coils in the second sequence.

12. The magnetic resonance imaging method according to claim 7, wherein:

the second sequence includes an IR pulse and a signal collecting pulse sequence for collecting nuclear magnetic resonance signals from the nuclear magnetization which is inverted by the IR pulse; and the first sequence includes the pulse sequence which is the same as the signal collecting pulse sequence.

* * * * *